United States Patent
Oomori

(10) Patent No.: US 11,714,440 B2
(45) Date of Patent: Aug. 1, 2023

(54) SEMICONDUCTOR DEVICE AND VOLTAGE GENERATION METHOD

(71) Applicant: LAPIS TECHNOLOGY CO., LTD, Yokohama (JP)

(72) Inventor: Tetsuo Oomori, Yokohama (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/702,466

(22) Filed: Mar. 23, 2022

(65) Prior Publication Data

US 2022/0317711 A1 Oct. 6, 2022

(30) Foreign Application Priority Data

Mar. 31, 2021 (JP) ................................. 2021-059107

(51) Int. Cl.
*G05F 1/56* (2006.01)

(52) U.S. Cl.
CPC ...................................... *G05F 1/56* (2013.01)

(58) Field of Classification Search
None
See application file for complete search history.

(56) References Cited

U.S. PATENT DOCUMENTS

| | | | | |
|---|---|---|---|---|
| 7,595,831 B2* | 9/2009 | Kameshima | ........... | H04N 5/357 348/308 |
| 8,217,635 B2* | 7/2012 | Nonis | ................... | H03G 1/0005 323/267 |
| 9,201,437 B2* | 12/2015 | Chang | ..................... | G05F 3/02 |
| 9,429,965 B2* | 8/2016 | D'Angelo | ............... | G05F 1/461 |
| 9,939,832 B2* | 4/2018 | Duong | ........................ | G05F 1/56 |
| 11,171,562 B1* | 11/2021 | Vilas Boas | ............. | G05F 1/575 |
| 11,336,174 B2* | 5/2022 | Chou | ..................... | H02M 3/07 |
| 2009/0147594 A1* | 6/2009 | Chou | ..................... | G11C 5/147 327/535 |
| 2009/0160557 A1* | 6/2009 | Luzzi | ..................... | G05F 3/262 330/288 |
| 2017/0052552 A1* | 2/2017 | Mahmoudi | ............. | G05F 1/575 |

FOREIGN PATENT DOCUMENTS

| | | |
|---|---|---|
| JP | 2004-110750 A | 4/2004 |
| JP | 2010-086021 A | 4/2010 |
| JP | 2018-180378 A | 11/2018 |

* cited by examiner

*Primary Examiner* — Thomas J. Hiltunen

(74) *Attorney, Agent, or Firm* — Volentine, Whitt & Francos, PLLC

(57) ABSTRACT

A semiconductor device includes first to N-th voltage output circuits each outputting an output voltage and outputs a feedback voltage having a voltage value corresponding to the output voltage, and a differential circuit including first to N-th primary side transistors to which N feedback voltages are input and that individually flow first to N-th currents through a first node, a secondary side transistor that flows a reference current corresponding to a reference voltage through the first node, and a current mirror circuit as an active load. The current mirror circuit includes first to N-th primary side load transistors individually coupled in cascade to the first to N-th primary side transistors, a secondary side load transistor coupled in cascade to the secondary side transistor and generates a voltage at a connection point between the secondary side transistor and the secondary side load transistor as a control voltage.

10 Claims, 5 Drawing Sheets

SEMICONDUCTOR DEVICE AND VOLTAGE GENERATION METHOD

CROSS-REFERENCE TO RELATED APPLICATION

This application is based upon and claims the benefit of priority from the prior Japanese Patent Application No. 2021-059107 filed on Mar. 31, 2021, the entire contents of which are incorporated herein by reference.

BACKGROUND OF THE INVENTION

1. Technical Field

The present invention relates to a semiconductor device and a voltage generation method to generate a constant voltage.

2. Description of the Related Art

In an IC chip as a semiconductor device, in addition to a plurality of circuit blocks serving various kinds of functions, a regulator that generates a power supply voltage for operating the circuit blocks is disposed.

As such a regulator, there is proposed a regulator that includes a transistor supplying a generated power supply voltage to a plurality of circuit blocks via one power supply output terminal and a differential amplifier circuit controlling the transistor (for example, see JP-A-2010-86021). The differential amplifier circuit disclosed in JP-A-2010-86021 includes a plurality of non-inverting input terminals that receives a plurality of voltages that each circuit block having a load has actually received and controls an output current of the above-described transistor corresponding to a difference between a voltage obtained by adding the plurality of voltages received at the plurality of non-inverting input terminals and a reference voltage.

As the regulator, there is proposed a regulator that includes a circuit generating a reference voltage the voltage value of which is constant, 2 systems of buffer amplifiers and power supply output terminals that output individually output voltages corresponding to the reference voltage to 2 systems of circuit blocks as power supply voltages (for example, see JP-A-2004-110750).

As a differential amplifier circuit including a plurality of non-inverting input terminals, there is proposed a differential amplifier circuit that includes a plurality of differential pairs each of which receives one of the voltages received at each non-inverting input terminal and a reference voltage and one system of current mirror circuit (for example, see JP-A-2018-180378). Each of the plurality of differential pairs includes a first current path and a second current path that flow currents corresponding to a ratio of the voltage received at the non-inverting input terminal to the reference voltage received at an inverting terminal. The first current path of each of the plurality of the differential pairs is commonly coupled a current path on an input side of the current mirror circuit, and the second current path is commonly coupled to a current path on an output side of the current mirror circuit. In this case, a current corresponding to a current flowing through a transistor included in the current path on the input side of the current mirror circuit is copied to a transistor included in the current path on the output side. With such a constitution, in the differential amplifier circuit disclosed in JP-A-2018-180378, a voltage corresponding to a difference between a voltage obtained by weight-averaging voltages received at each non-inverting input terminal and the reference voltage received at the inverting input terminal is generated on the current path on the output side of the current mirror circuit, and this voltage is output.

SUMMARY OF THE INVENTION

In the regulator disclosed in JP-A-2010-86021, the power supply voltage generated by the regulator is supplied to each of the plurality of circuit blocks via wirings. In this case, the longer the wiring length, the higher the wiring resistance, and by that amount, a reduction amount of the power supply voltage increases due to an increase in a current consumed by the circuit block having a load.

In the regulator disclosed in JP-A-2004-110750, since buffer amplifiers and power supply output terminals that individually output the power supply voltage for each of the plurality of circuit blocks are disposed, it is possible to reduce the increase of the reduction amount of the power supply voltage due to the wiring resistance.

Thus, it is conceivable to apply the technique of JP-A-2004-110750 to JP-A-2010-86021, and employ the constitution disclosed in JP-A-2018-180378 as the differential amplifier circuit including the plurality of non-inverting input terminals disclosed in JP-A-2010-86021. In this case, a feedback voltage from each circuit block is supplied to the plurality of non-inverting input terminals of the differential amplifier circuit, respectively. Thus, in a current mirror circuit of the differential amplifier circuit that employs the constitution disclosed in JP-A-2018-180378, a combined current of currents corresponding to respective feedback voltage flows through one transistor included in a current path (also referred to as a primary side current path) on an input side.

Now, variation timing and magnitude of the feedback voltages from each of the plurality of circuit blocks are different for each circuit block. In this case, there are problems that the one transistor included in the primary side current path of the current mirror circuit cannot deal with current variations individually generated in each of the plurality of circuit blocks and it becomes difficult to stably generate the power supply voltages for each of the plurality of circuit blocks.

Thus, it is an object of the present invention to provide a semiconductor device and a voltage generation method that can stably supply a power supply voltage for each of a plurality of circuit blocks.

A semiconductor device according to the present invention includes first to N-th (N is an integer equal to or more than 2) voltage output circuits and a differential circuit. The first to N-th voltage output circuits each output an output voltage and outputting a voltage corresponding to the output voltage as a feedback voltage. The differential circuit that includes: first to N-th primary side transistors that receive N feedback voltages output from the first to N-th voltage output circuits and individually flow first to N-th currents to a first node; and a secondary side transistor that receives a reference voltage and flows a reference current corresponding to the reference voltage to the first node. The differential circuit includes a current mirror circuit that includes: first to N-th primary side load transistors that are individually coupled in cascade to the respective first to N-th primary side transistors, the respective first to N-th currents flowing through the first to N-th primary side load transistors; and a secondary side load transistor that is coupled in cascade to the secondary side transistor, a current corresponding to a combined current of the first to N-th currents flowing through the first to N-th primary side load transistors flowing through the secondary side load transistor.

A voltage generation method according to the present invention generates an output voltage in a semiconductor device. The semiconductor device includes first to N-th (N is an integer equal to or more than 2) voltage output circuits that receive a control voltage and generates the output voltage corresponding to the control voltage, a current mirror circuit including first to N-th primary side load transistors and a secondary side load transistor, a differential circuit including first to N-th primary side transistors and a secondary side transistor coupled in cascade to the secondary side load transistor. The method includes: outputting a voltage generated at an output node as the output voltage by each of the first to N-th voltage output circuits generating a current corresponding to the control voltage and delivering the currents to their own output nodes; generating a feedback voltage having a voltage value corresponding to the output voltage; and supplying a voltage generated at a connection point between the secondary side transistor and the secondary side load transistor as the control voltage to the first to N-th voltage output circuits, the voltage being generated by the differential circuit receiving the N feedback voltages generated at the first to N-th voltage output circuits, flowing the first to N-th currents to a first node via the first to N-th primary side load transistors and the first to N-th primary side transistors, copying a current corresponding to a combined current of the first to N-th currents and flowing the copied current to the secondary side load transistor while flowing a reference current corresponding to a reference voltage to the first node via the secondary side transistor, and flowing the current corresponding to the combined current of the first to N-th currents to the secondary side load transistor.

In the present invention, as the primary side of the current mirror circuit that becomes a load to a differential circuit, first to N-th load transistors that receive N feedback voltages and each individually flow first to N-th currents are disposed.

Thus, compared to a case employing a constitution that receives N feedback voltages as the primary side of the current mirror circuit and flows a combined current of the first to N-th currents through the single load transistor, this allows dealing with the current variations individually generated in each of the plurality of circuit blocks. Furthermore, this allows stably supplying the power supply voltages for each of the plurality of circuit blocks.

Therefore, according to the present invention, it is possible to stably supply a power supply voltage for each of a plurality of circuit blocks.

DETAILED DESCRIPTION OF THE INVENTION

The following describes embodiments of the present invention in detail with reference to the accompanied drawings.

Figure 1:
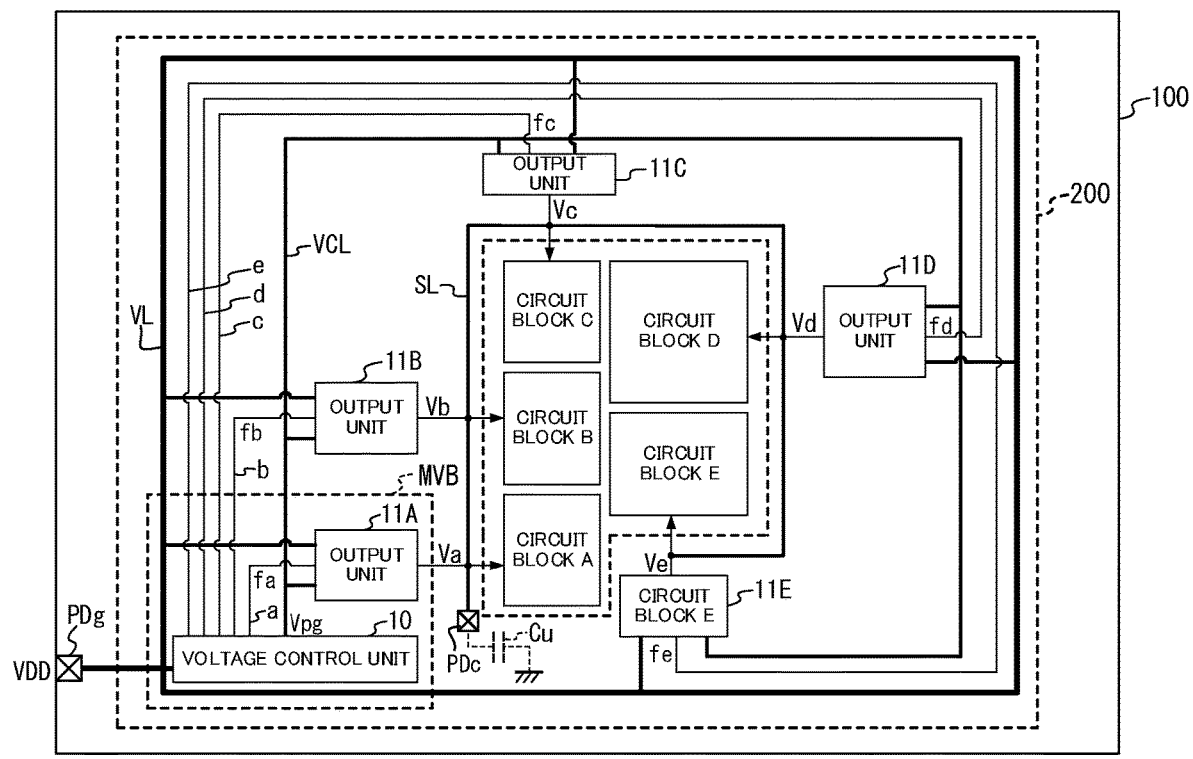
FIG. 1 is a drawing illustrating one example of a chip layout of a semiconductor chip as a semiconductor device according to a first embodiment.

FIG. 1 is a drawing illustrating one example of a chip layout of a semiconductor chip 100 as a semiconductor device according to a first embodiment.

In the semiconductor chip 100, circuit blocks A to E each of which is constituted of an analog circuit network or a digital circuit network are formed. The circuit blocks A to E each have a load.

In the semiconductor chip 100, as a regulator 200 that generates power supply voltages operating the circuit blocks A to E based on a power supply voltage VDD supplied from an outside of the chip and outputs them to each circuit block, a voltage control unit 10 and output units 11A to 11E are disposed.

In the semiconductor chip 100, a power supply pad PDg for receiving the power supply voltage VDD from the outside of the chip and a pad PDc for externally mounting an output stabilization capacitor Cu are disposed. Further the power supply pad PDg is disposed in a vicinity of one corner of four corners of the semiconductor chip 100 having a rectangular surface.

Further, in the semiconductor chip 100, as described below, a power supply line VL, feedback lines a to e, a voltage control line VCL, and an output short circuit line SL are wired.

The power supply line VL is coupled to the power supply pad PDg and is wired along an outer periphery of the semiconductor chip 100 so as to surround the voltage control unit 10, the circuit blocks A to E, and the output units 11A to 11E.

The feedback line a is wired between the voltage control unit 10 and the output unit 11A. The feedback line b is wired between the voltage control unit 10 and the output unit 11B. The feedback line c is wired between the voltage control unit 10 and the output unit 11C. The feedback line d is wired between the voltage control unit 10 and the output unit 11D. The feedback line e is wired between the voltage control unit 10 and the output unit 11E.

The voltage control line VCL is wired along the voltage control unit 10, the output units 11A to 11E.

The output short circuit line SL is coupled to the pad PDc for externally mounting the above-described output stabilization capacitor Cu. Furthermore, the output short circuit line SL is wired along the output units 11A to 11E and short-circuits respective output node of the output units 11A to 11E. This allows sharing the single capacitor Cu by each of the output units 11A to 11E, and thus, it is only necessary to dispose only one pad PDc for externally mounting the capacitor Cu. Consequently, compared to a case where the pad PDc for externally mounting the output stabilization capacitor Cu is disposed for each of the output units 11A to 11E, it is possible to reduce an occupied area of the regulator inside the semiconductor chip 100.

The voltage control unit 10 is disposed in the vicinity of the power supply pad PDg. The voltage control unit 10 receives the power supply voltage VDD via the power supply pad PDg, generates a control voltage Vpg controlling the voltage supplied to each circuit block so as to be maintained at a predetermined voltage value, and supplies it to each of the output units 11A to 11E via the voltage control line VCL.

The voltage control unit 10 is formed together with the output unit 11A in a region MVB in the vicinity of the output unit 11A in the semiconductor chip 100.

The output unit 11A is disposed on an outer peripheral side of the semiconductor chip 100 with respect to the circuit block A in the vicinity of the circuit block A. The output unit 11A receives the power supply voltage VDD via the power supply line VL and generates the power supply voltage that operates the circuit block A as an output voltage Va. Furthermore, the output unit 11A supplies a voltage corresponding to the voltage value of the output voltage Va to the voltage control unit 10 as a feedback voltage fa, via the feedback line a.

The output unit 11B is disposed on the outer peripheral side of the semiconductor chip 100 with respect to the circuit block B in the vicinity of the circuit block B. The output unit 11B receives the power supply voltage VDD via the power supply line VL and generates the power supply voltage that operates the circuit block B as an output voltage Vb. Furthermore, the output unit 11B supplies the voltage corresponding to the voltage value of the output voltage Vb to the voltage control unit 10 as a feedback voltage fb, via the feedback line b.

Similarly for the output units 11C to 11E, each of the output units 11C to 11E is disposed on the outer peripheral side of the semiconductor chip 100 with respect to each of the circuit blocks C to E in the vicinity of each of the circuit blocks C to E. The output units 11C to 11E receive the power supply voltage VDD via the power supply line VL and generate the power supply voltages that operate the circuit blocks C to E, respectively, as output voltages Vc to Ve. Furthermore, the output units 11C to 11E supply the voltages corresponding to the voltage values of the respective output voltages Vc to Ve to the voltage control unit 10 as feedback voltages fc to fe via the feedback lines c to e, respectively.

By disposing each of the output units 11A to 11E in the vicinity of each of the circuit blocks A to E, the wiring length of the wiring disposed between each of the output units 11A to 11E and each of the circuit blocks A to E can be shortened.

Figure 2:
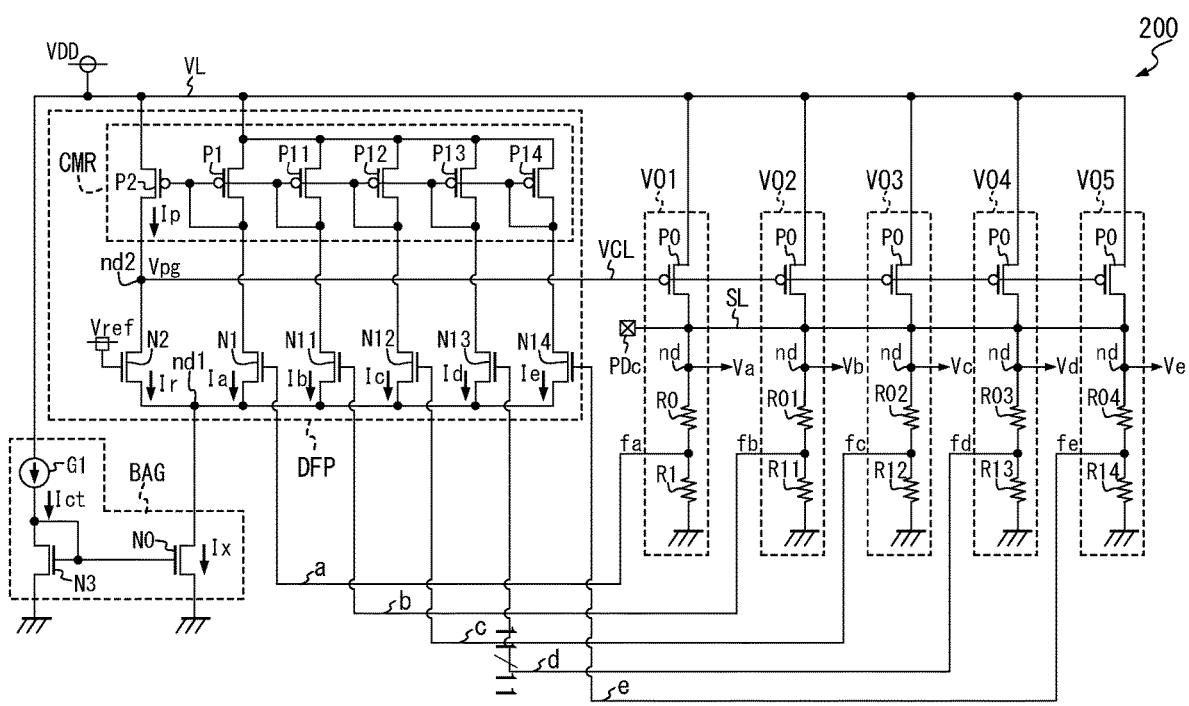
FIG. 2 is a circuit diagram illustrating a regulator included in the semiconductor device according to the first embodiment.

FIG. 2 is a circuit diagram illustrating the regulator 200 formed of the voltage control unit 10 and the output units 11A to 11E illustrated in FIG. 1 on the chip layout.

As illustrated in FIG. 2, the regulator 200 includes a bias current generating circuit BAG, a differential circuit DFP, and voltage output circuits VO1 to VO5. In the first embodiment illustrated in FIG. 1, the differential circuit DFP and the bias current generating circuit BAG are formed in the voltage control unit 10. Furthermore, the voltage output circuit VO1 is formed in the output unit 11A illustrated in FIG. 1, the voltage output circuit VO2 is formed in the output unit 11B illustrated in FIG. 1, the voltage output circuit VO3 is formed in the output unit 11C illustrated in FIG. 1, the voltage output circuit VO4 is formed in the output unit 11D illustrated in FIG. 1, the voltage output circuit VO5 is formed in the output unit 11E illustrated in FIG. 1, The bias current generating circuit BAG includes a current source G1 and n channel metal oxide semiconductor (MOS) type transistors N0 and N3.

The current source G1 of the bias current generating circuit BAG generates a constant current Ict based on the power supply voltage VDD and supplies it to the transistor N3 and the transistor N0. The current source G1 is coupled to a drain of the transistor N3. The drain and a gate of the transistor N3 are coupled to a gate of the transistor N0. A ground potential is applied to sources of the transistors N3 and N0. A drain of the transistor N0 is coupled to a node nd1 of the differential circuit DFP.

With such constitution, the bias current generating circuit BAG flows a current corresponding to the constant current Ict to the node nd1 as a bias current Ix as a total current flowing through the differential circuit DFP, via the transistor N0 as a constant current source.

The differential circuit DFP includes n channel MOS type transistors N1 and N11 to N14 as a primary side transistor, an n channel MOS type transistor N2 as a secondary side transistor, and a current mirror circuit CMR. The current mirror circuit CMR includes p channel MOS type transistors P1 and P11 to P14 as a primary side load transistor and a p channel MOS type transistor P2 as a secondary side load transistor.

In the differential circuit DFP, the foregoing node nd1 is coupled to sources of the respective transistors N1, N2, N11 to N14. The feedback line a is coupled to a gate of the transistor N1, and a drain of the transistor P1 of the current mirror circuit CMR is coupled to a drain of the transistor N1. The feedback line b is coupled to a gate of the transistor N11, and a drain of the transistor P11 of the current mirror circuit CMR is coupled to a drain of the transistor N11. The feedback line c is coupled to a gate of the transistor N12, and a drain of the transistor P12 of the current mirror circuit CMR is coupled to a drain of the transistor N12. The feedback line d is coupled to a gate of the transistor N13, and a drain of the transistor P13 of the current mirror circuit CMR is coupled to a drain of the transistor N13. The feedback line e is coupled to a gate of the transistor N14, and a drain of the transistor P14 of the current mirror circuit CMR is coupled to a drain of the transistor N14. The reference voltage Vref having a predetermined fixed voltage value is applied to a gate of the transistor N2. A drain of the transistor N2 is coupled to a drain of the transistor P2 of the current mirror circuit CMR and the voltage control line VCL via a node nd2.

In the current mirror circuit CMR, the power supply voltage VDD is applied to sources of the respective transistors P1, P11 to P14 and P2, via the power supply line VL. Drains and gates of the respective transistors P1, P11 to P14 are commonly coupled to a gate of the transistor P2.

With such constitution, in the differential circuit DFP, the transistors N1, N11 to N14 flow currents Ia to Ie to the node nd1, the currents Ia to Ie respectively corresponding to differences between the above-described feedback voltages fa to fe received via the feedback lines a to e and the reference voltage Vref. Furthermore, a current Ip corresponding to a combined current of the currents Ia to Ie is copied to the secondary side transistor P2 of the current mirror circuit CMR and is delivered to the node nd2, while the secondary side transistor N2 flows a reference current Ir corresponding to the reference voltage Vref through the node nd1. Then, Ip=Ir, because the secondary side transistor P2 of the current mirror circuit CMR is coupled in cascade to the secondary side transistor N2.

Consequently, respective current values of the reference current Ir and the currents Ia to Ie become the values that satisfy the following relationship:

$$Ir:Ia:Ib:Ic:Id:Ie=Vref:fa:fb:fc:fd:fe$$

$$Ix=Ir+Ia+Ib+Ic+Id+Ie.$$

That is, in the differential circuit DFP, the bias current Ix is divided into the reference current Ir and the currents Ia to Ie, by a ratio of respective voltage values of the reference voltage Vref and the feedback voltages fa to fe. In other words, the current Ia is passed through a first primary side current path constituted of the transistors P1 and N1, the current Ib is passed through a second primary side current path constituted of the transistors P11 and N11, and the current Ic is passed through a third primary side current path constituted of the transistors P12 and N12. Furthermore, the current Id is passed through a fourth primary side current path constituted of the transistors P13 and N13, and the current Ie is passed through a fifth primary side current path constituted of the transistors P14 and N14. The reference current Ir is passed through a secondary side current path constituted of the transistors P2 and N2.

With those configurations, the current Ip corresponding to the combined current of the respective currents Ia to Ie corresponding to the difference between the respective feedback voltages fa to fe and the reference voltage Vref is copied to the transistor P2 and, by delivering the current Ip to the node nd2, which is a connection point of the transistor N2 and the transistor P2 of the current mirror circuit CMR, a voltage is generated at the node nd2. In other words, a voltage corresponding to a difference between a combined voltage of the feedback voltages fa to fe (hereinafter also referred to as a combined feedback voltage) and the reference voltage Vref is generated. Then the voltage generated at the node nd2 is supplied to the voltage output circuits VO1 to VO5 as the above-described control voltage Vpg via the voltage control line VCL.

In this case, for example, when the feedback voltages fa to fe are lower than the reference voltage Vref, the voltage value of the control voltage Vpg becomes smaller as the difference between both of them becomes larger. When the feedback voltages fa to fe are equal to or more than the reference voltage Vref, the voltage value of control voltage Vpg becomes larger.

Each of the voltage output circuits VO1 to VO5 includes a transistor P0 as an output transistor and feedback resistors R0, R01 to R04, R1, and R11 to R14, respectively.

The power supply voltage VDD is applied to a source of the transistor P0 as the output transistor of each of the voltage output circuits VO1 to VO5 via the power supply line VL, and the control voltage Vpg is commonly applied to a gate via the voltage control line VCL. Further, one end of each of the feedback resistors is coupled to a drain of each transistor P0 via an output node nd.

The feedback resistors of the respective voltage output circuits VO1 to VO5 are constituted of a pair of resistors outputting a divided voltage obtained by dividing a voltage at the output node nd as the feedback voltage. Further, the feedback resistor of the voltage output circuit VO1 are constituted of the resistors R0 and R1 coupled in series to its own output node nd. The feedback resistors of the voltage output circuit VO2 are constituted of the resistors R01 and R11 coupled in series to its own output node nd. Further, the feedback resistors of the voltage output circuit VO3 are constituted of the resistors R02 and R12 coupled in series to its own output node nd. The feedback resistors of the voltage output circuit VO4 are constituted of the resistors R03 and R13 coupled in series to its own output node nd. The feedback resistors of the voltage output circuit VO5 are constituted of the resistors R04 and R14 coupled in series to its own output node nd.

In addition, Resistance values of the feedback resistors of the respective voltage output circuits VO1 to VO5 are individually set based on magnitude of the current variations at the respective circuit blocks A to E where the voltage output circuits VO1 to VO5 are coupled.

In this case, in each of the voltage output circuits VO1 to VO5, the transistor P0 delivers an output current corresponding to the control voltage Vpg received via the voltage control line VCL to its own output node nd. This outputs the voltage generated at the output node nd as the output voltage. Furthermore, each of the voltage output circuits VO1 to VO5 supplies a voltage obtained by dividing the output voltage by the respective feedback resistors to the voltage control unit 10 as the feedback voltage, via the feedback line.

That is, the voltage output circuit VO1 outputs the output voltage Va generated in accordance with the control voltage Vpg from its own output node nd and supplies the feedback voltage fa obtained by dividing the output voltage Va by the resistors R0 and R1 to the gate of the transistor N1, via the feedback line a. The voltage output circuit VO2 outputs the output voltage Vb generated in accordance with the control voltage Vpg from its own output node nd and supplies the feedback voltage fb obtained by dividing the output voltage Vb by the resistors R01 and R11 to the gate of the transistor N11, via the feedback line b. The voltage output circuit VO3 outputs the output voltage Vc generated in accordance with the control voltage Vpg from its own output node nd and supplies the feedback voltage fc obtained by dividing the output voltage Vc by the resistors R02 and R12 to the gate of the transistor N12, via the feedback line c. The voltage output circuit VO4 outputs the output voltage Vd generated in accordance with the control voltage Vpg from its own output node nd and supplies the feedback voltage fd obtained by dividing the output voltage Vd by the resistors R03 and R13 to the gate of the transistor N13, via the feedback line d. The voltage output circuit VO5 outputs the output voltage Ve generated in accordance with the control voltage Vpg from its own output node nd and supplies the feedback voltage fe obtained by dividing the output voltage Ve by the resistors R04 and R14 to the gate of the transistor N14, via the feedback line e.

Further the drain of the transistor P0 of each of the voltage output circuits VO1 to VO5 is short-circuited with one another by an output short circuit line SL.

In the following, the operation of the regulator 200 illustrated in FIG. 2 will be described by taking a case where a target voltage value required as the output voltages Va to Ve is RV as an example. It is assumed that, when the voltage value of each of the output voltages Va to Ve is equal to the target voltage value RV, at least, the voltage value of the reference voltage Vref and a resistance ratio of the feedback resistors of the respective voltage output circuits VO1 to VO5 are set such that the reference voltage Vref matches with the combined feedback voltage obtained by combining the feedback voltages fa to fe.

In this case, while all the output voltages Va to Ve are maintained at the target voltage value RV, as described above, the reference voltage Vref matches with the combined feedback voltage obtained by combining the feedback voltages fa to fe. Consequently, during this period, the differential circuit DFP supplies the control voltage Vpg having a high voltage value that sets the transistor P0 to an OFF state to the gate of the transistor P0 of each of the voltage output circuits VO1 to V05, via the voltage control line VCL.

Then, for example, when, by the current variation in association with a load increase in at least one circuit block of the circuit blocks A to E, the voltage values of the output voltages Va to Ve fall below the target voltage value RV, the voltage values of the feedback voltages fa to fe are decreased by that amount. Accordingly, since the combined feedback voltage becomes lower than the reference voltage Vref, the control voltage Vpg also lowers, and the transistor P0 of each of the voltage output circuits VO1 to VO5 is turned to an ON state. This results in delivering the output current corresponding to the control voltage Vpg by the transistor P0, and thus, the voltage values of the output voltages Va to Ve are increased. In this case, when the voltage values of the output voltages Va to Ve reach the target voltage value RV, the combined feedback voltage obtained by combining the feedback voltages fa to fe becomes equal to the reference voltage Vref, and, as described above, the transistor P0 is turned to the OFF state.

Accordingly, in the regulator 200 illustrated in FIG. 2, by repeating the above-described operation, regardless of the current variation due to the circuit blocks A to E, the voltage values of the output voltages Va to Ve can be maintained at the target voltage value RV.

Now, when a current variation amount between the respective circuit blocks is large and the circuit blocks with different speeds of a transient current variation are used, a transient response speed, which causes the varied voltage to reach the target voltage value RV, decreases, in some cases.

Thus, in such a case, the resistance values of the feedback resistors of the voltage output circuit corresponding to the circuit block where the above-described variation occurs among the circuit blocks A to E are decreased without changing the resistance ratio.

For example, when the current variation amount of the circuit block B is larger than that of the circuit block A, the resistance values of the feedback resistors R01, R11 included in the voltage output circuit VO2 are set to be smaller than the resistance values of the feedback resistors R0, R1 included in the voltage output circuit V01. Further, for example, when the current variation amount of the circuit block C is smaller than that of the circuit block A, the resistance values of the feedback resistors R02, R12 included in the voltage output circuit VO3 are set to be larger than the resistance values of the feedback resistors R0, R1 included in the voltage output circuit V01.

This allows uniformizing transient response characteristics of the respective voltage output circuits VO1 to VO5 even when the current variation amounts of the respective circuit blocks A to E are different, and thus, occurrence of the variation of the output voltage, an excessive overshoot or an excessive undershoot are suppressed.

As described above, in the semiconductor device of the first embodiment, the first to fifth load transistors P1, P11 to P14 are disposed as the primary side of the current mirror circuit CMR that is a load of the differential circuit. This allows dealing with each of the current variations that individually occurs in each of the plurality of circuit blocks and supplying the power supply voltage stably to each of the plurality of circuit blocks.

In addition, the resistance values are changed correspondingly to each of the current variations of the respective plurality of circuit blocks without changing the ratio of the feedback resistors of the voltage output circuit. This suppresses the occurrence of the variation of the output voltage and the excessive overshoot or undershoot.

In the above-described first embodiment, while the first to fifth primary side current paths are constituted in the voltage control unit 10 together with the secondary side current path, the first to fifth primary side current paths may be included in the output units 11A to 11E corresponding to the respective voltage output circuits VO1 to V05.

Figure 3:
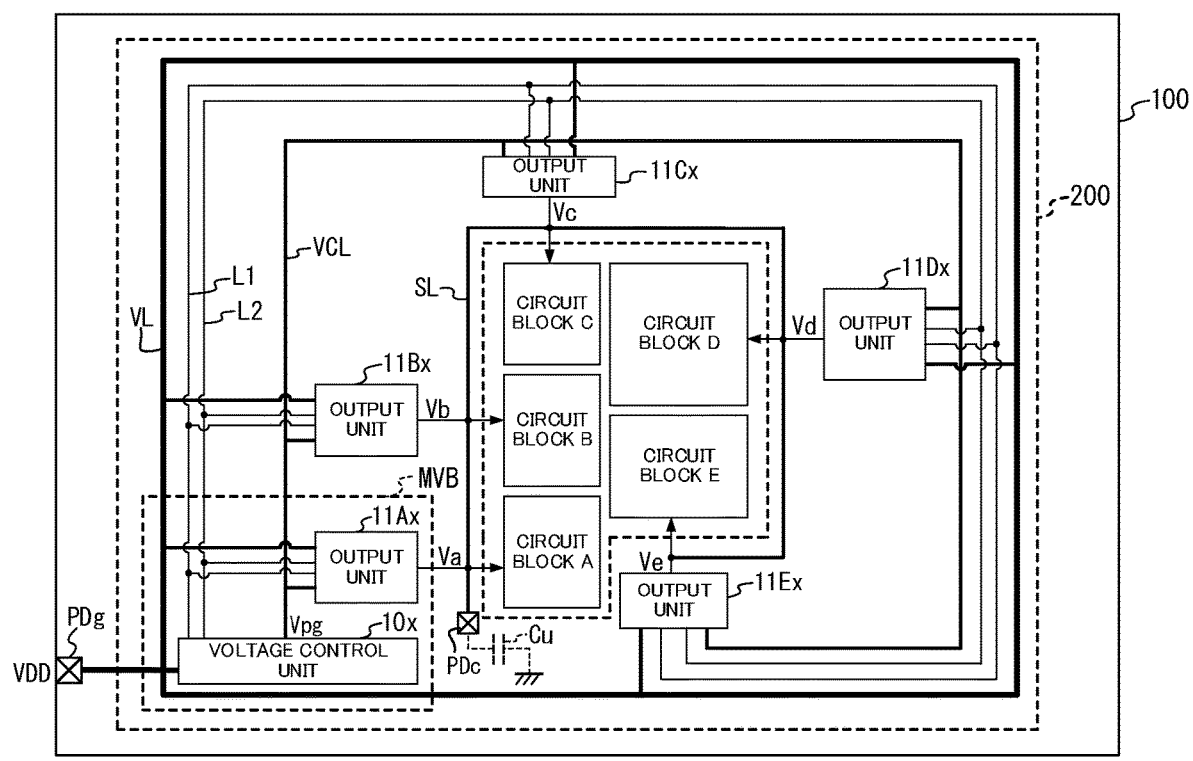
FIG. 3 is a diagram illustrating one example of a chip layout of a semiconductor chip as a semiconductor device according to a second embodiment.

FIG. 3 is a drawing illustrating one example of a chip layout of a semiconductor chip as a semiconductor device according to a second embodiment that is made in consideration of such a point.

In the chip layout illustrated in FIG. 3, the other constitutions except that the output units 11A to 11E are replaced to output units 11Ax to 11Ex, the voltage control unit 10 is replaced to a voltage control unit 10x, and wirings L1 and L2 are disposed instead of the feedback lines a to e are similar to those of the first embodiment illustrated in FIG. 1.

Figure 4:
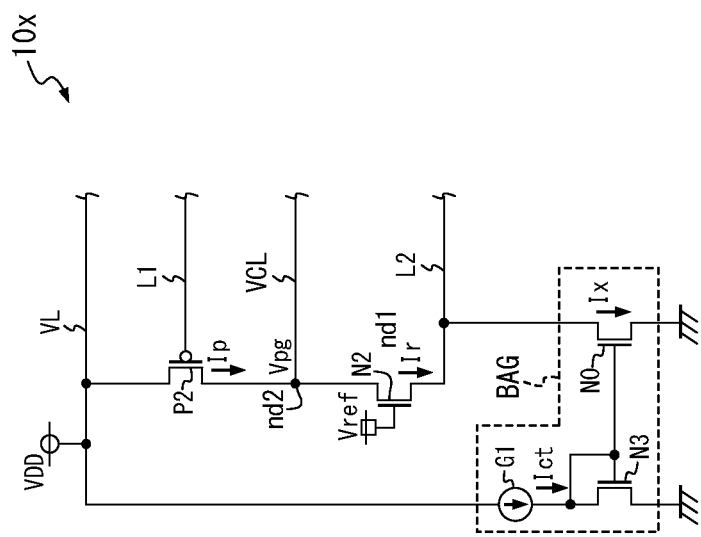
FIG. 4 is a circuit diagram illustrating one example of a circuit formed in a voltage control unit that is apart of a regulator included in the semiconductor device according to the second embodiment.
Figure 5:
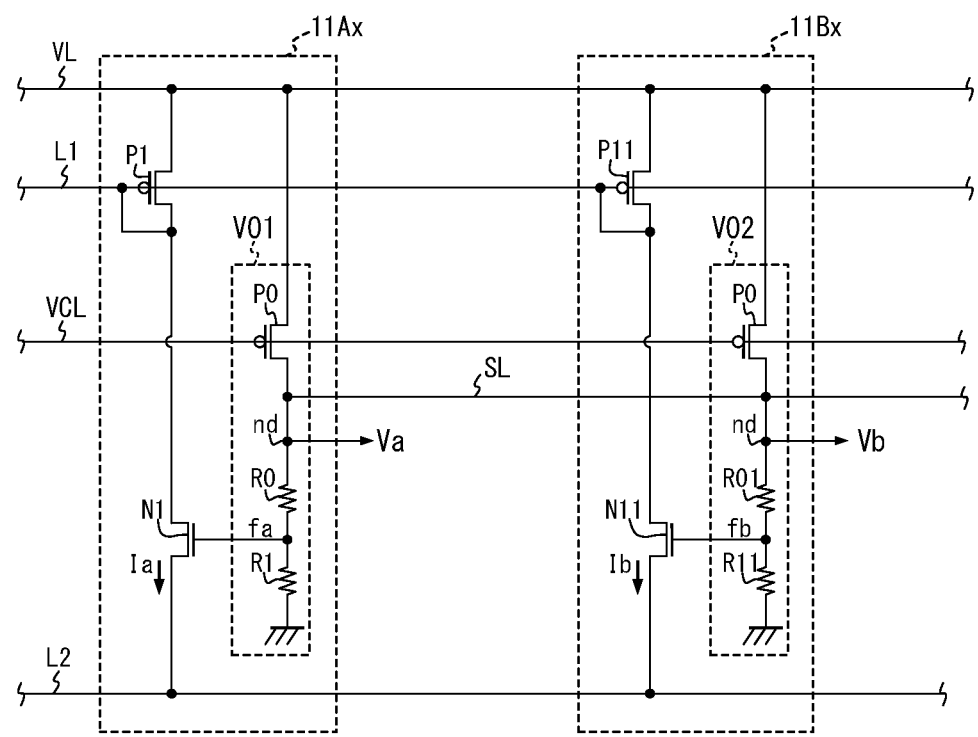
FIG. 5 is a circuit diagram illustrating one example of a circuit formed in first and second output units by extracting the first and second output units from first to fifth output units that is a part of the regulator included in the semiconductor device according to the second embodiment, respectively.

Further, in the constitutions of the regulator illustrated in FIG. 4 and FIG. 5, the other constitutions except the points that wirings L1, L2 are added, and the layout is changed are similar to those of the regulator 200 of the first embodiment illustrated in FIG. 2. In FIG. 4 and FIG. 5, features of the second embodiment are excerpted. Specifically, FIG. 4 is a circuit diagram representing a circuit formed in the voltage control unit 10x, of the regulator 200 illustrated in FIG. 2. FIG. 5 is a circuit diagram representing a circuit formed in the respective output units 11Ax and 11Bx excerpted from the output units 11Ax to 11Ex.

That is, as illustrated in FIG. 4, in the voltage control unit 10x, the bias current generating circuit BAG, the secondary side transistor P2 of the current mirror circuit CMR, and the secondary side transistor N2 of the differential circuit DFP, which are illustrated in FIG. 2, are formed. The wiring L1 is coupled to the gate of the transistor P2, and the wiring L2 is coupled to the source of the transistor N2.

Further, as illustrated in FIG. 5, in the output unit 11Ax, together with the voltage output circuit VO1 illustrated in FIG. 2, a first primary side current path constituted of the primary side transistor N1 of the differential circuit DFP and the primary side load transistor P1 of the current mirror circuit CMR is formed. The wiring L1 is coupled to the gate of the transistor P1, and the wiring L2 is coupled to the source of the transistor N1. In the output unit 11Bx, together with the voltage output circuit VO2 illustrated in FIG. 2, a second primary side current path constituted of the primary side transistor N11 of the differential circuit DFP and the primary side load transistor P11 of the current mirror circuit CMR is formed. The wiring L1 is coupled to the gate of the transistor P11, and the wiring L2 is coupled to the source of the transistor N11. In the output unit 11Cx, together with the voltage output circuit VO3 illustrated in FIG. 2, a third primary side current path constituted of the primary side transistor N12 of the differential circuit DFP and the primary side load transistor P12 of the current mirror circuit CMR is formed. The wiring L1 is coupled to the gate of the transistor P12, and the wiring L2 is coupled to the source of the transistor N12. In the output unit 11Dx, together with the voltage output circuit VO4 illustrated in FIG. 2, a fourth primary side current path constituted of the primary side transistor N13 of the differential circuit DFP and the primary side load transistor P13 of the current mirror circuit CMR is formed. The wiring L1 is coupled to the gate of the transistor P13, and the wiring L2 is coupled to the source of the transistor N13. In the output unit 11Ex, together with the voltage output circuit VO5 illustrated in FIG. 2, a fifth primary side current path constituted of the primary side transistor N14 of the differential circuit DFP and the primary side load transistor P14 of the current mirror circuit CMR is formed. The wiring L1 is coupled to the gate of the transistor P14, and the wiring L2 is coupled to the source of the transistor N14.

According to the above-described second embodiment, by disposing the first to fifth primary side current paths in the vicinity of the corresponding voltage output circuits VO1 to VO5, respectively, the wiring lengths of the feedback lines a to e can be shortened compared with the first embodiment, and thus, an influence of an inter-wiring capacitance can be reduced.

As described above, in the semiconductor device according to the second embodiment, in addition to the effect in the first embodiment, the influence of the inter-wiring capacitance can be reduced by disposing the primary side current paths in the vicinity of the corresponding voltage output circuits, respectively.

In the above-described embodiments, according to the number of the circuit blocks A to E formed in the semiconductor chip 100, the number of the voltage output circuits VO1 to VO5 is also five. However, the number of the voltage output circuits is not limited to five, and it is only necessary to dispose two or more voltage output circuits according to the number of the circuit blocks that require the power supply voltage.

In the above-described embodiments, the regulator 200 is constituted by the differential circuit DFP, the bias current generating circuit BAG, and the voltage output circuits VO1 to V05, which are illustrated in FIG. 2. However, the differential circuit DFP, the bias current generating circuit BAG, and the voltage output circuits VO1 to VO5 may be used to constitute, for example, a reference voltage generating circuit that generates a reference voltage having a constant voltage value.

Basically, it is only necessary that the semiconductor device where such a voltage generating circuit is constituted includes the following differential circuit and first to N-th (N is an integer equal to or more than 2) voltage output circuits.

That is, each of the first to N-th voltage output circuits (for example, VO1 to V05) receives a control voltage (Vpg), generates an output current corresponding to the control voltage, and, by delivering the output current to its own output node (nd), outputs a voltage generated at the output node as an output voltage (for example, Va to Ve). Furthermore, the first to N-th voltage output circuits generate N (N is an integer of 2) feedback voltages (for example, fa to fe) having voltage values corresponding to each output voltage.

The differential circuit (DFP) includes first to N-th primary side transistors, secondary side transistor, and a current mirror circuit as a load, which are described below. The first to N-th primary side transistors (for example, N1, N11 to N14) individually flow first to N-th currents (for example, Ia to Ie) corresponding to each of differences between the respective N feedback voltages (for example, fa to fe) output from the first to N-th voltage output circuits and a reference voltage (Vref), respectively, through a first node (nd1). The secondary side transistor (N2) flows a reference current (Ir) corresponding to the reference voltage (Vref) through a first node. The current mirror circuit (CMR) includes first to N-th primary side load transistors (for example, P1, P11 to P14) that are individually coupled in cascade to the first to N-th primary side transistors and where the first to N-th currents individually flows, a secondary side load transistor (P2) that is coupled in cascade to the secondary side transistor (N2) and where a current (Ip) corresponding to a combined current of the first to N-th currents flowing through the first to N-th primary side load transistors flows. The current (Ip) corresponding to the combined current of the first to N-th currents is passed through a connection point (nd2) between the secondary side transistor (N2) and the secondary side load transistor (P2), and the reference current (Ir) corresponding to the reference voltage (Vref) is passed through the first node (nd1). The differential circuit (DFP) supplies a voltage at the connection point (nd2) between the secondary side transistor (N2) and the secondary side load transistor (P2) as a control voltage (Vpg) to the first to N-th voltage output circuits.

In the present invention, as the primary side of the current mirror circuit (CMR) that is a load of the differential circuit, the first to N-th load transistors (for example, P1, P11 to P14) that receive the N feedback voltages output from the first to N-th voltage output circuits and individually flow the first to N-th currents are disposed.

This configuration allows dealing with the current variation individually generated in each circuit block and stably generating the power supply voltage, compared with a case employing a primary side that receives the N feedback voltages and flows the combined current of the first to N-th currents through a single load transistor, as the primary side of the current mirror circuit.

Therefore, according to the present invention, it is possible to stably supply the power supply voltage to each of the plurality of circuit blocks.

The differential circuit, the bias current generating circuit, and the first to N-th voltage output circuits, which are described above, may be constituted discretely instead of the semiconductor chip.

What is claimed is:

1. A semiconductor device comprising:
   first to N-th voltage output circuits each outputting an output voltage and outputting a voltage corresponding to the output voltage as a feedback voltage, wherein N is an integer equal to or more than 2; and
   a differential circuit that includes:
   first to N-th primary side transistors that receive N feedback voltages output from the first to N-th voltage output circuits and individually flow first to N-th currents to a first node; and
   a secondary side transistor that receives a reference voltage and flows a reference current corresponding to the reference voltage to the first node, wherein
   the differential circuit includes a current mirror circuit that includes:
   first to N-th primary side load transistors that are individually coupled in cascade to the respective first to N-th primary side transistors, the respective first to N-th currents flowing through the first to N-th primary side load transistors; and
   a secondary side load transistor that is coupled in cascade to the secondary side transistor, a current corresponding to a combined current of the first to N-th currents flowing through the first to N-th primary side load transistors flowing through the secondary side load transistor,
   wherein the first to N-th voltage output circuits receive a control voltage that is a voltage at a connection point between the secondary side transistor and the secondary side load transistor, and deliver output currents corresponding to the control voltage to their own output nodes and outputs voltages generated at the output nodes as the output voltages,
   each of the first to N-th primary side load transistors is constituted of a p channel type transistor whose source is applied with a power supply potential, and a gate and a drain of the p channel type transistor are coupled with one another,
   the secondary side load transistor is constituted of a second p channel type transistor whose source is applied with the power supply potential, a gate of the second p channel type transistor is coupled to each gate of the first to N-th primary side load transistors, and a drain of the second p channel type transistor is coupled to a second node, the first to N-th primary side transistors are constituted of n channel type transistors whose drains are individually coupled to the respective drains of the first to N-th primary side load transistors, respective sources of the n channel type transistors are commonly coupled to the first node, and respective gates of the n channel type transistors receive the feedback voltages, the secondary side transistor is constituted of a second n channel type transistor whose drain is coupled to the drain of the secondary side load transistor via the second node, a source of the second n channel type transistor is coupled to the first node, and a gate of the second n channel type transistor receives the reference voltage, and the voltage at the second node is supplied as the control voltage to the first to N-th voltage output circuits.

2. The semiconductor device according to claim 1, further comprising:
an output short circuit line that short-circuits the output nodes of the respective first to N-th voltage output circuits; and
a single pad coupled to the output short circuit line, the pad being used for externally mounting a capacitor.

3. The semiconductor device according to claim 1, wherein each of the first to N-th voltage output circuits includes:
an output transistor that receives the control voltage at a gate of the output transistor, generates a current corresponding to the control voltage based on the power supply voltage, and delivers the current as the output current to the output node; and
a feedback resistor unit that includes a first resistor having one end coupled to the output node and a second resistor coupled to another end of the first resistor, and generates a voltage obtained by dividing the output voltage by the first resistor and the second resistor as the feedback voltage.

4. The semiconductor device according to claim 3, wherein resistance values of the first resistor and the second resistor are set to unique values for each of the first to N-th voltage output circuits.

5. The semiconductor device according to claim 1, further comprising a bias current generating circuit that is coupled to the first node, the bias current generating circuit generating a bias current corresponding to a total current that is a sum of combined current of the first to N-th currents and the reference current.

6. The semiconductor device according to claim 1, wherein the first to N-th primary side transistors and the first to N-th primary side load transistors are disposed in a near position of the secondary side transistor and the secondary side load transistor.

7. The semiconductor device according to claim 1, wherein the respective first to N-th primary side transistors and the respective first to N-th primary side load transistors are disposed in a distributed manner in a near position of the respective first to N-th voltage output circuits.

8. The semiconductor device according to claim 1, further comprising a circuit region where first to N-th circuit blocks that are each constituted of an analog circuit network or a digital circuit network and receive the output voltages are formed,
wherein in a peripheral area of the circuit region, the respective first to N-th voltage output circuits are disposed in a distributed manner in near positions of the respective circuit blocks.

9. The semiconductor device according to claim 8, wherein a power supply pad that receives the power supply voltage is disposed in a vicinity of one corner of four corners of a semiconductor chip, and
the differential circuit is disposed in a vicinity of the power supply pad.

10. A voltage generation method for generating an output voltage in a semiconductor device, wherein
the semiconductor device includes first to N-th voltage output circuits that receive a control voltage and generates the output voltage corresponding to the control voltage, a current mirror circuit including first to N-th primary side load transistors and a secondary side load transistor, a differential circuit including first to N-th primary side transistors and a secondary side transistor coupled in cascade to the secondary side load transistor, wherein N is an integer equal to or more than 2, and
the method comprises:
outputting a voltage generated at an output node as the output voltage by each of the first to N-th voltage output circuits generating a current corresponding to the control voltage and delivering the currents to their own output nodes;
generating a feedback voltage having a voltage value corresponding to the output voltage; and
supplying a voltage generated at a connection point between the secondary side transistor and the secondary side load transistor as the control voltage to the first to N-th voltage output circuits, the voltage being generated by the differential circuit receiving N feedback voltages generated at the first to N-th voltage output circuits, flowing first to N-th currents to a first node via the first to N-th primary side load transistors and the first to N-th primary side transistors, copying a current corresponding to a combined current of the first to N-th currents and flowing the copied current to the secondary side load transistor while flowing a reference current corresponding to a reference voltage to the first node via the secondary side transistor, and flowing the current corresponding to the combined current of the first to N-th currents to the secondary side load transistor.

* * * * *